United States Patent [19]

Lebailly et al.

[11] Patent Number: 4,563,541
[45] Date of Patent: Jan. 7, 1986

[54] PACKAGE PROVIDING HIGH HEAT DISSIPATION, IN PARTICULAR FOR MICROELECTRONICS

[75] Inventors: Michel Lebailly, Bollene; Maurice Jacquemin, La Garde Adhemar, both of France

[73] Assignee: L.C.C.-C.I.C.E.-Compagnie Europeenne de Composants Electroniques, Paris, France

[21] Appl. No.: 567,878

[22] Filed: Jan. 3, 1984

[30] Foreign Application Priority Data

Jan. 7, 1983 [FR] France .................. 83 00172

[51] Int. Cl.$^4$ .......................................... H01L 23/10
[52] U.S. Cl. .................. 174/52 FP; 357/74; 420/502; 420/507; 420/558; 420/566
[58] Field of Search ............ 174/52 FP; 357/74; 420/456, 470, 489, 497, 501, 502, 507, 512, 557, 558, 560, 566, 570

[56] References Cited

U.S. PATENT DOCUMENTS

| | | | |
|---|---|---|---|
| 4,266,089 | 5/1981 | Scherer | 174/52 FP |
| 4,266,090 | 5/1981 | Scherer | 174/52 FP |
| 4,361,720 | 11/1982 | Resneau et al. | 174/52 FP X |
| 4,451,540 | 5/1984 | Baird et al. | 174/52 FP X |

Primary Examiner—A. T. Grimley
Assistant Examiner—D. A. Tone
Attorney, Agent, or Firm—Oblon, Fisher, Spivak, McClelland & Maier

[57] ABSTRACT

A package of the flatpack type for microelectronic circuits comprises a metal base of material having good heat conductivity on which a metal frame is mounted by means of a hard brazing alloy. The frame has the function of supporting connections by means of insulating lead-in bushings of the glass bead type. The coefficient of expansion of the frame and of the base are matched so as to ensure that the base of the package does not exhibit any defect of surface planarity after cooling.

5 Claims, 4 Drawing Figures

FIG_1-a
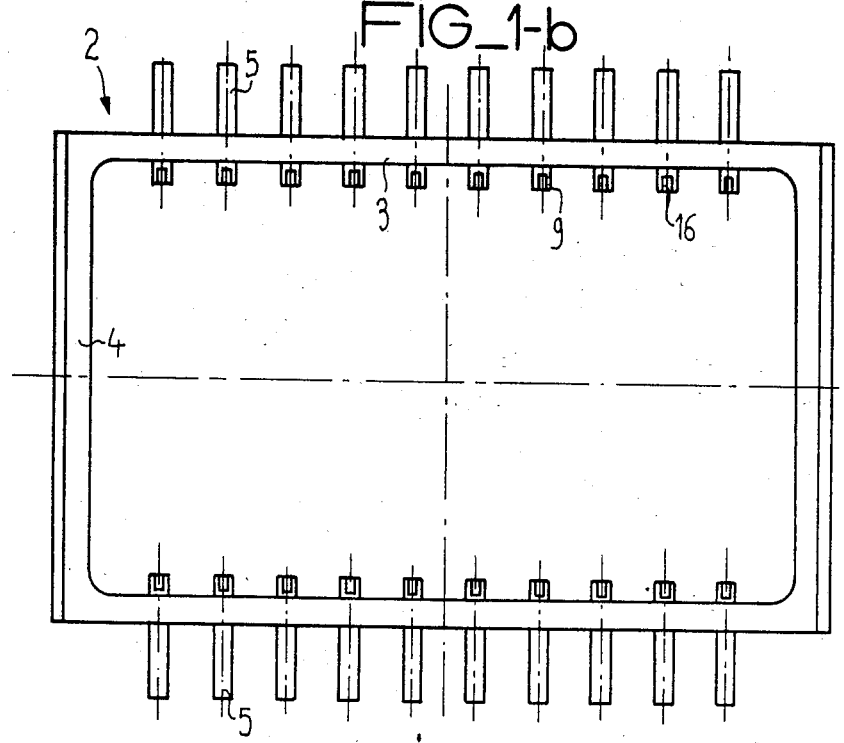
FIG_1-b
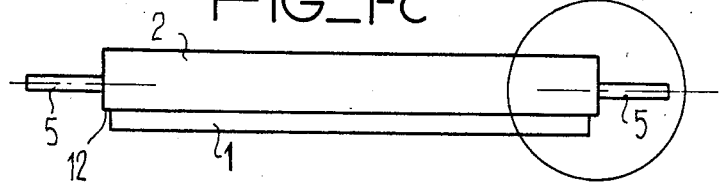
FIG_1-c
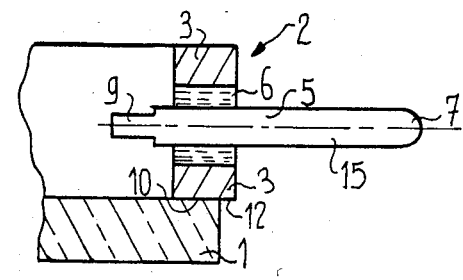
FIG_1-d

PACKAGE PROVIDING HIGH HEAT DISSIPATION, IN PARTICULAR FOR MICROELECTRONICS

BACKGROUND OF THE INVENTION

1. Field of the Invention

This invention relates to a package or flatpack which provides high heat dissipation, in particular for microelectronics.

2. Description of the Prior Art

It is known that current advances in the fabrication of integrated circuits and hybrid circuits result in heat dissipations per unit area which exhibit a constantly rising trend.

Removal of the heat thus produced must be performed by means of the package on which the circuit or circuits are mounted.

Under these conditions, the package must essentially ensure optimum heat resistance in order to be capable of removing a large number of calories per unit area of substrate (by way of example, heat resistances as low as 1° C./W are desirable).

A hermetically-sealed package of a currently available type is thus already known and constituted by a body or cup of Fe-Ni-Co alloy in which lead-in bushings, also formed of Fe-Ni-Co alloy, are sealed with a borosilicate glass. A substrate is bonded or brazed to the base of the package which is a poor heat dissipator by reason of the fact that it is formed of Fe-Ni-Co alloy.

SUMMARY OF THE INVENTION

This invention therefore relates to a high heat-dissipation package which is particularly well-suited to microelectronic integrated circuits and/or hybrid circuits and has optimum heat resistance which is compatible with a reduction in size of packages.

The invention is thus concerned with a package of the flatpack type which provides high heat dissipation. The package essentially comprises a metal base of material having good heat conductivity on which is mounted by means of a hard brazing alloy a metal frame having the function of supporting connections by means of insulating lead-in bushings of the glass bead type. The material of the frame and of the base are chosen so as to ensure that their thermal expansion coefficients are close in value at least over a substantial portion of the temperature range which extends from room temperature up to the coalescence temperature of the hard brazing alloy, with the result that the base of the package does not exhibit any defect of surface planarity after cooling.

The material constituting the glass beads advantageously has a thermal expansion coefficient which is lower than or equal to that of the material which forms the metal frame.

In accordance with a first alternative embodiment, at least one of the materials is magnetic and the thermal expansion coefficients of the two materials are close in value from room temperature to the Curie temperature of the magnetic material or materials.

The base can thus be of molybdenum and the frame can be of Fe-Ni-Co alloy. The hard brazing alloy can contain, by weight, 72% silver and 28% copper. The insulating bushings can be of borosilicate glass and the connections can consist of pins of Fe-Ni-Co.

The base can also be of beryllium oxide and the frame can be of Fe-Ni alloy containing a percentage of Ni within the range of 42 to 54% by weight. The percentage content of Ni is preferably equal to 50%. The hard brazing alloy can be selected from Ag-Cu and Ag-Cu-In. The insulating lead-in bushings can be of soda-lime glass and the connections can be pins of Fe-Ni alloy. The connector-pins preferably contain the same proportion of Ni as the metal frame.

In a second alternative embodiment, the base is of copper and the frame is of stainless steel, that is to say of materials having closely related thermal expansion coefficients from room temperature to the coalescence temperature of the hard brazing alloy such as Ni-Au, for example. The insulating lead-in bushings can be of soda-lime glass and the connections can consist of pins of Fe-Ni alloy.

The invention also relates to a package as hereinabove defined and comprising at least one substrate brazed to the base by means of a hard brazing alloy having a brazing temperature which is below that of the alloy employed for brazing the metal frame to the base and consisting, for example, of Au-Sn which has the lowest melting point of all hard brazing alloys, or by means of a soft brazing alloy having a high melting point such as, for example, Sn-Pb-Ag or Pb-Ag.

BRIEF DESCRIPTION OF THE DRAWINGS

Other features of the invention will be more apparent upon consideration of the following description and accompanying drawings, wherein:

FIG. 1a is a side view of a package in accordance with the invention;

FIG. 1b is a top view of the package;

FIG. 1c is a left-hand view of the package shown in FIG. 1a;

FIG. 1d illustrates a detail of FIG. 1c.

DETAILED DESCRIPTION OF THE INVENTION

The package or flatpack in accordance with the invention comprises a base 1 having good thermal conductivity to which is brazed a frame 2 having longitudinal sides 3 in which connections 5 are sealed by means of glass beads, and transverse sides 4. Since suitable sealing means do not have very good thermal conductivity, the use of an added base is advantageous from a thermal standpoint. The frame 2 (as shown in FIG. 1d) is brazed at 10 to the base 1 and accordingly has external dimensions which are larger than those of the base 1 in order to produce stepped projections 12 on the longitudinal sides 3 and stepped projections 11 on the transverse sides 4. It will be noted that the transverse sides 4 are provided for this purpose with two cant faces 8 while the top portions of the transverse sides 4 are located (as shown in FIG. 1a) at a distance from each other which is smaller than the length of the base 1.

The connections 5 are designed in the form of pins, each pin being held in position by an insulating lead-in bushing 6, a glass bead being used for this purpose in accordance with conventional practice. Each connector-pin 5 has a portion 15 which projects outward from the package and has a round-nosed end 7 and a portion 9 which projects within the package and has an end-slit 16 for soldering a connecting lead of the circuit or circuits to be mounted within the package. After mounting one or a number of substrates on the package, a cover (not shown in the drawings) is soldered or brazed to the frame 2 in order to make the package completely air-tight. The brazing operation can be performed in a conventional manner by interposing a preform of fusible alloy.

It will be recalled that the maximum operating temperature of a semiconductor chip on a substrate is nominally of the order of 120° C. to 130° C. and that there is therefore no problem of thermal resistance of brazed joints of the package after it has been put into service.

In accordance with the invention, the frame 2 is brazed to the base by means of a hard brazing filler metal and more specifically an alloy. A hard brazing alloy is defined as an alloy which exhibits only elastic deformations after cooling and practically no plastic deformation or even none at all. As a general rule, brazing with these filler metals or alloys is carried out at relatively high temperatures except, however, in the case of the brazing alloy Au-Sn which contains 80% gold and 20% tin and forms a brazed joint above 280° C. A soft brazing alloy usually has a base of tin-lead (Sn-Pb) which has a low Young's modulus and which is consequently liable to be subjected to elastic deformations and plastic deformations.

A package of this type is intended to receive one or a number of substrates which are bonded to the package by brazing. In practice, however, it is necessary in the first place to braze the substrate or substrates to the base of the package in such a manner as to prevent remelting of the brazing alloy between the base and the frame. In the second place, the present Applicant has found that hard brazing alloys have better thermal conductivity than soft alloys. And among the soft alloys, the best thermal properties are exhibited by brazing alloys which have a high melting point.

Aside from the fact that the base or bottom wall of the package has very good intrinsic thermal conductivity, optimization of thermal conduction between substrate and base is accordingly dependent on the possibility of bonding the substrate or substrates at a relatively high temperature. Since the hard or soft brazing alloys which are favorable from a thermal standpoint all have a relatively high melting point, it consequently proves necessary to braze the frame 2 itself to the base 3 by means of a hard filler metal or alloy. Failure to satisfy this condition would result in partial remelting of the brazed joint at the level of the frame at the time of brazing of the substrate to the base and in deficient air-tightness of the package.

As mentioned earlier, the frame receives connections which are held in position by glass beads. Materials which are compatible with bonding of glass beads do not have very good heat conductivity whereas, in accordance with the invention, the material constituting the base must have a degree of heat conductivity which is as high as possible. In point of fact, a hard brazing alloy must exhibit practically no plastic deformation as mentioned earlier. In accordance with the invention, the material of the frame and the material of the base are chosen with a view to ensuring that their thermal expansion coefficients are close in value at least over a substantial part of the temperature range which extends from room temperature to the melting point of the hard brazing alloy, with the result that the base does not show any evidence of defective surface planarity after cooling.

In particular, magnetic materials exhibit curves of thermal expansion having an inflection point at their Curie temperature. The present Applicant has observed, however, that even when using hard brazing alloys at temperatures well above the Curie temperature, mechanical strength and air-tightness of the package was maintained on condition that the coefficients of expansion of the two materials were close in value within the temperature range below the Curie temperature, whether one material or two materials having a Curie point are employed. A probable explanation for this phenomenon is that a hard brazing alloy in the solid state is liable to undergo plastic deformations when heated to a high temperature or, in other words, that a hard alloy has the same behavior as a soft brazing alloy in the vicinity of its melting point and exhibits plastic-state absorption of the differences in the coefficient of expansion.

EXAMPLE I

There is formed a package provided with a base of molybdenum and with a frame of Fe-Ni-Co alloy such as, for example, the alloy marketed by the Imphy steelworks under the trade name Dilver P1 and containing a proportion by weight of 54% Fe, 29% Ni and 17% Co or else the alloy also produced by the Imphy steelworks under the trade name Dilver P0 and containing the same proportions (54% Fe, 29% Ni, 17% Co). The coefficient of thermal expansion of these two alloys below their Curie point (425° C. and 420° C. respectively) is equal to approximately $50 \times 10^{-7}/°C.$ and $47 \times 10^{-7}/°C.$ repsectively and their expansion curve becomes parallel to that of Fe or of Ni above the Curie point.

Assembly of the package takes place in two operations, that is, a first pass through a furnace in which connector-pins of a Fe-Ni-Co alloy (preferentially of the same alloy as the frame) are set in position by fusion of beads of borosilicate glass (for example the 747 glass manufactured by the Sovirel Company or the 7052 glass manufactured by Corning Glass Works), and a second pass through the furnace in which the frame and the base are brazed together in the vicinity of 800° C. by means of an Ag-Cu brazing alloy containing a proportion by weight of 72% Ag and 28% Cu, or in the vicinity of 720° C. by means of an Ag-Cu-In brazing alloy containing a proportion by weight of 60% Ag, 27% Cu and 13% In, or else in the vicinity of 600° C. by means of an Ag-Cu-Sn brazing alloy containing a proportion by weight of 42% Ag, 33% Cu and 25% Sn.

EXAMPLE II

There is formed a package provided with a base of beryllium oxide (coefficient of expansion: $90 \times 10^{-7}$) and with a frame of Fe-Ni alloy containing a proportion by weight of 50% Fe and 50% Ni (coefficient of expansion equal to approximately $102 \times 10^{-7}$ below the Curie point). It will be noted that the coefficient of expansion of the Fe-Ni alloy below the Curie point varies from 60 to $105 \times 10^{-7}$ when the percentage of Ni varies from 42 to 54%, with the result that a percentage of Ni in the vicinity of 50% may be found suitable for matching the coefficients of expansion. Beyond the Curie point, and irrespective of the percentage of Ni, the expansion curve of the Fe-Ni alloys becomes practically parallel to that of Fe or of Ni.

Assembly of the package takes place in two operations, that is to say a first pass through the furnace in which pins of Fe-Ni alloys, and preferably of the same alloy as the frame, are set in position by fusion of beads of soda-lime glass, and a second pass through the furnace in which the frame and the base are brazed together at 600° C. by means of an Ag-Cu-Sn brazing alloy containing a proportion by weight of 42% Ag, 33% Cu and 25% Sn or in the vicinity of 800° C. by means of an Ag-Cu brazing alloy containing a proportion by weight of 72% Ag and 28% Cu.

EXAMPLE III

There is formed a package provided with a base of Cu and with a frame of stainless steel, both having a coefficient of expansion of $165 \times 10^{-7}$ approximately up to 600° C. and showing only slight variation above this temperature. Assembly of the package takes place in two operations, namely a first pass through the furnace in which pins of Fe-Ni containing in particular a proportion by weight of Ni equal to 50% are set in position by fusion of glass beads of soda-lime glass (especially a glass known as Type T manufactured by the Fusite Company or a glass known as Type 9013 manufactured by Corning Glass Works) at about 1000° C., and a second pass through the furnace in which the frame and the base are brazed together at about 720° C. by means of an Ag-Cu-In brazing alloy containing a proportion by weight of 60% Ag, 27% Cu and 13% In or in the vicinity of 800° C. by means of an Ag-Cu brazing alloy containing a proportion by weight of 72% Ag and 28% Cu.

EXAMPLE IV

As in Example III, the base of the package is of Cu and the frame is of stainless steel.

The package is assembled in a single pass through the furnace in which pins of Fe-Ni alloy (for example containing 50% by weight of Ni) are set in position by fusion of glass beads of soda-lime glass (especially the Type T glass manufactured by the Fusite Company or the Type 9013 glass manufactured by Corning Glass Works) and brazing of the frame to the base is carried out by means of an Au-Ni brazing alloy. The usual brazing temperature (in the vicinity of 950° C.) of the Au-Ni brazing alloy (which melts at 900° C.) is in fact compatible with the fusion temperature of soda-lime glasses, with the result that these two operations can take place at the same temperature (in the vicinity of 1000° C).

The stainless steel is preferably pre-coated, prior to brazing, with a layer of Ni of sufficient thickness (4 to 6 microns, for example) in order to prevent diffusion of the chromium contained in the stainless steel and in order to prevent it from oxidizing at the time of brazing.

The package in accordance with the invention offers a number of different advantages. In the first place, the base of material having good thermal conductivity constitutes in itself a good heat dissipator. The use of a hard brazing alloy for mounting the frame on the base and more particularly of a hard brazing alloy having a high melting point makes it possible to ensure that the substrate or substrates can be fixed on the base of the package by means of a hard brazing alloy having a lower melting point than the first, thus ensuring the best possible thermal contact. The brazing process is carried out in vapor phase even with soft brazing alloys which have high melting points (for example 280° C. in the case of the Sn-Pb-Ag brazing alloy and up to 305° C. in the case of the Pb-Ag brazing alloy) and which have the best thermal properties among the soft brazing alloys.

Furthermore, at the time of cooling of the brazed joint, matching of the coefficients of expansion between the material constituting the frame and the material constituting the base makes it possible, in spite of the rigidity of the hard brazing alloy in the solid state, to prevent residual stresses from producing a defect in surface planarity of the base of the package which would not be conducive to a good thermal contact of the substrate.

It will be noted that in all cases, brazing of the substrate to the base can be carried out with the hard brazing alloy which has the lowest melting point, namely Au-Sn which can be brazed at 280° C.

What is claimed is:

1. A package providing high heat dissipation, comprising:
    a copper metal base having good heat conductivity on which is mounted by means of a Au-Ni brazing alloy, a stainless steel frame which supports connections by means of insulating lead-in bushings of the soda-lime glass bead type, said connections being pins of a Fe-Ni alloy.

2. The package of claim 1, wherein said soda-lime glass bushings have a thermal coefficient which is lower than or equal to that of the stainless steel frame.

3. The package of claim 1, wherein the copper metal base and the stainless steel frame have thermal expansion coefficients which are close in value from room temperature to the Curie temperature of the two materials.

4. The package of claim 1, wherein said stainless steel frame is coated before brazing with a layer of Ni.

5. The package of claim 4, wherein said precoated Ni layer is 4 to 6 microns thick.

* * * * *